United States Patent [19]

German

[11] Patent Number: 5,168,995
[45] Date of Patent: Dec. 8, 1992

[54] PINCH CLIP LID FOR NON-HERMETIC PACKAGES

[75] Inventor: Richard A. German, Hillsboro, Oreg.

[73] Assignee: Tektronix, Inc., Wilsonville, Oreg.

[21] Appl. No.: 720,033

[22] Filed: Jun. 24, 1991

[51] Int. Cl.⁵ .............................. B65D 73/02
[52] U.S. Cl. .................... 206/328; 206/334; 220/323; 220/324; 220/326
[58] Field of Search ........ 206/328, 329, 334; 220/241, 242, 306, 307, 323, 324, 326

[56] References Cited

U.S. PATENT DOCUMENTS

| | | | |
|---|---|---|---|
| 1,477,043 | 12/1923 | Drake | 220/323 |
| 1,835,951 | 12/1931 | Kendall | 220/326 |
| 3,278,066 | 10/1966 | George et al. | 220/241 |
| 3,349,481 | 10/1967 | Karp | 206/329 |
| 3,684,817 | 8/1972 | Card, Jr. et al. | 220/306 |
| 3,990,604 | 11/1976 | Barnett et al. | 220/323 |
| 4,094,436 | 6/1978 | Birmingham | 220/307 |
| 4,494,651 | 1/1985 | Malcolm | 206/328 |
| 4,560,083 | 12/1985 | Danico | 220/241 |
| 4,655,364 | 4/1987 | Swapp et al. | 206/334 |
| 5,058,743 | 10/1991 | Marsh et al. | 206/331 |

*Primary Examiner*—David T. Fidei
*Attorney, Agent, or Firm*—Francis I. Gray; Boulden G. Griffith

[57] ABSTRACT

A pinch clip lid for a non-hermetic package containing an electronic component having an exposed face has a step lid that includes means for centering the lid on the package. Attached to opposing sides of the lid are side bars that have a lower portion that extends slightly inwardly to grip the package when the lid is mounted on the package, and that have an upper portion contiguous with the lower portion so that when the top portions are pinched, the lower portions release the grip on the package so that the lid may be removed from or placed on the package.

12 Claims, 3 Drawing Sheets

PINCH CLIP LID FOR NON-HERMETIC PACKAGES

BACKGROUND OF THE INVENTION

The present invention relates to integrated circuit packaging, and more particularly to a pinch clip lid for non-hermetic packages, such as charge-coupled device (CCD) imagers, that eliminates particulate contamination of the exposed surfaces of the electronic components within the packages and prevents physical damage to the exposed surfaces during handling.

Certain integrated circuit component packages, such as CCD imagers, are non-hermetic so that the circuits, when installed in their operating environment, are exposed to ambient conditions, such as light. However during handling and installation, prior to actual operation, these circuits are susceptible to particulate contamination and inadvertent contact with circuit elements that can cause physical damage, resulting in degradation of the circuit within the package to the extent of inoperability.

Co-pending U.S. patent application No. 07/586,665 filed Sep. 24, 1990, now U.S. Pat. No. 5,058,743 by Harry H. March and Terry L. Whalen entitled "Antistatic, Low Particulate Shipping Container for Electronic Components" discloses a shipping container for non-hermetic electronic component packages that includes a windowed lid over the exposed area of the electronic component within the package. However the lid slides on and off the package which requires in some instances that the lid be removed prior to installing the package since there may not be room to slide the lid off once the package is installed.

Therefore what is desired is a lid for non-hermetic electronic component packages that protects the exposed surfaces of the electronic component from particulate contamination or physical damage due to handling when the package is installed, but which is easily removable when the electronic component is to be put into operation.

SUMMARY OF THE INVENTION

Accordingly the present invention provides a pinch clip lid for non-hermetic packages that contain electronic components where the electronic component has an exposed face. The lid has a self centering, electrically conductive step lid that has an electrically conductive coated transparent window attached to the step lid. The window and step lid are held together by an electrically conductive cover to which is attached a pair of opposing pinch clips. A lower portion of the pinch clips extend slightly inwardly to contact and grip the non-hermetic package, while an upper portion extends slightly outwardly above the lid such that by exerting pressure on the upper portions to bring them closer together, i.e., pinching the pinch clips, the lower portions release the package, while releasing the pressure causes the lower portion to return to the slightly inwardly position to grip the package.

The objects, advantages and other novel features of the present invention are apparent from the following detailed description when read in conjunction with the appended claims and attached drawing.

DESCRIPTION OF THE PREFERRED EMBODIMENT

Figure 1:
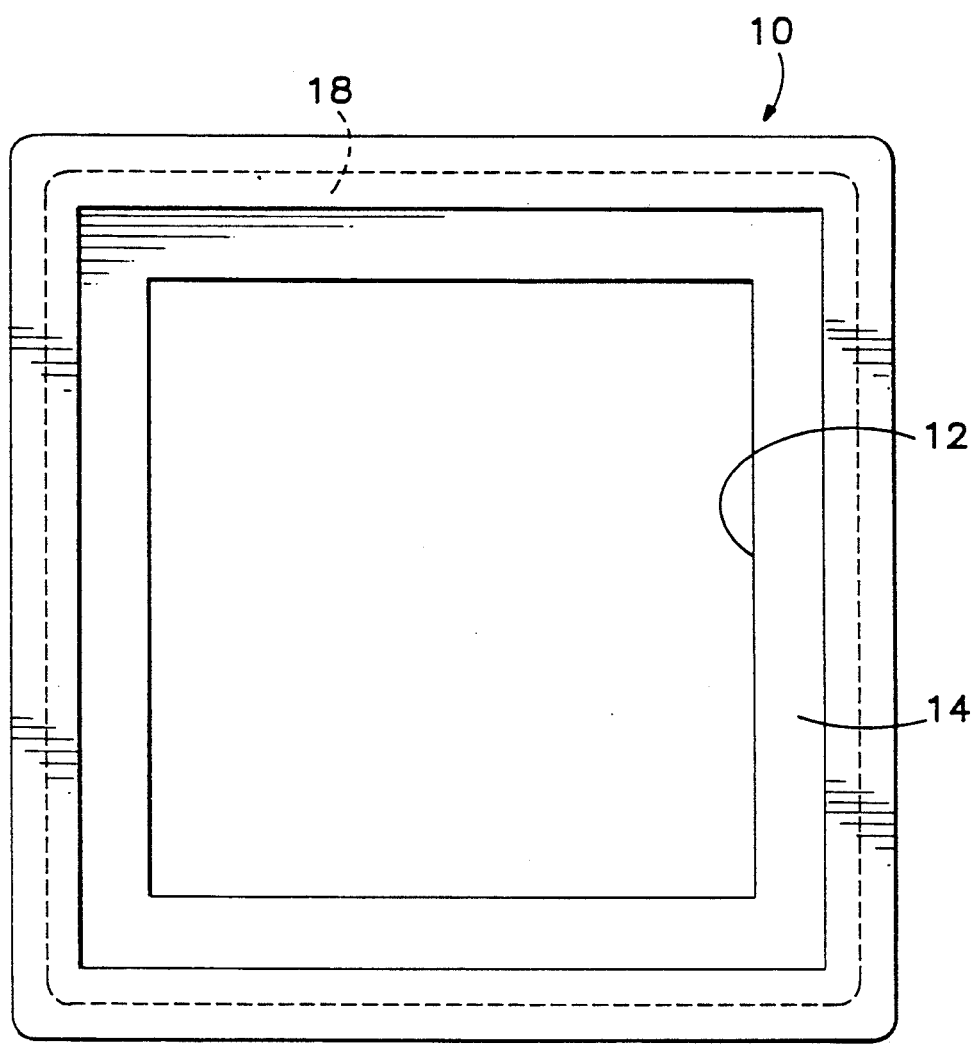
FIG. 1 is a top plan view of a step lid for the pinch clip lid of the present invention.
Figure 2:
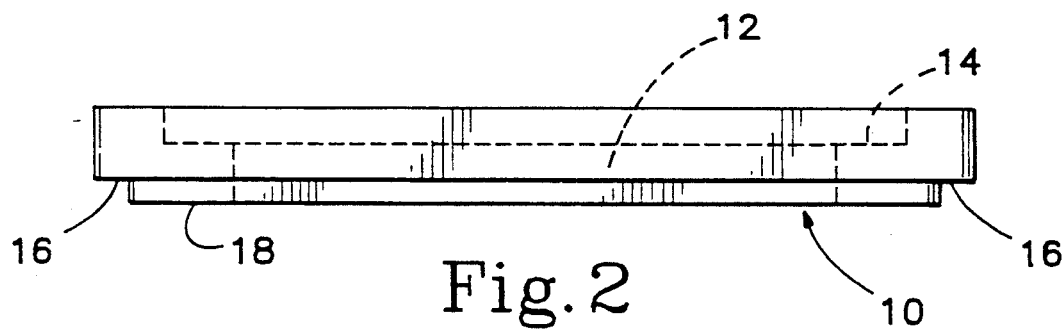
FIG. 2 is a side plan view of the step lid of FIG. 1.

Referring now to FIGS. 1 and 2 a step lid 10 for the pinch clip lid of the present invention is shown. The step lid 10 has a central aperture 12 with a shelf 14 on which a transparent window may be attached to provide a viewing port. The step lid 10 includes on the bottom side a peripheral notch 16 that defines a centering portion 18 that fits within the shoulder of a non-hermetic package 40 to center the lid on the package. The step lid may be manufactured from ninety percent (90%) black alumina ceramic with nichrome sputtered on both sides or from aluminum plated with nickel or aluminum with etch and chromate finish to make it electrically conductive, typically with a resistance of between five to twenty ohms per square. The transparent window is suitably a borosilicate glass coated with an indium-tin oxide electrically conductive coating that is mounted within the aperture 12 on the shelf 14.

Figure 3:
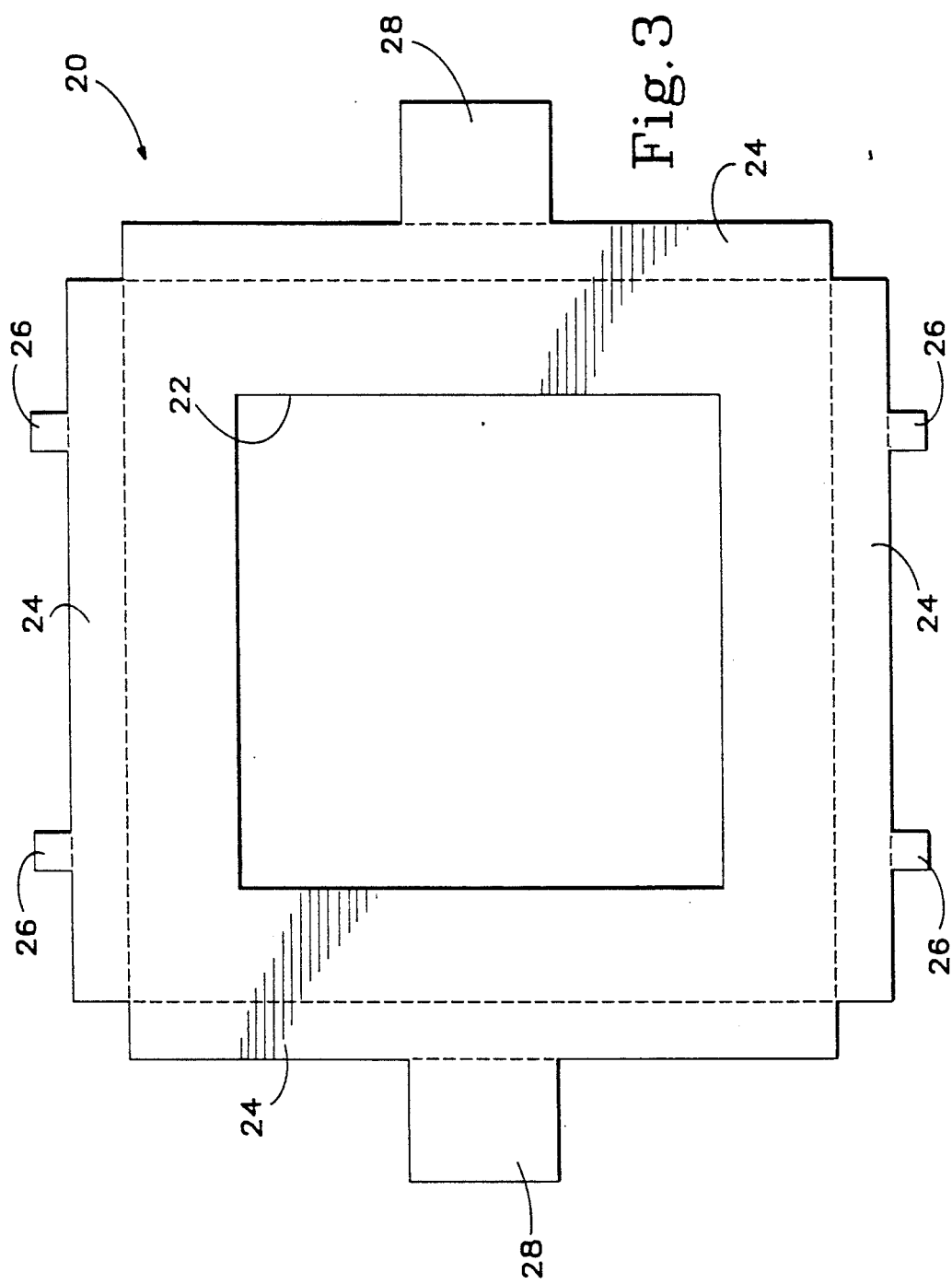
FIG. 3 is a plan view of a cover for the pinch clip lid of the present invention.
Figure 4:
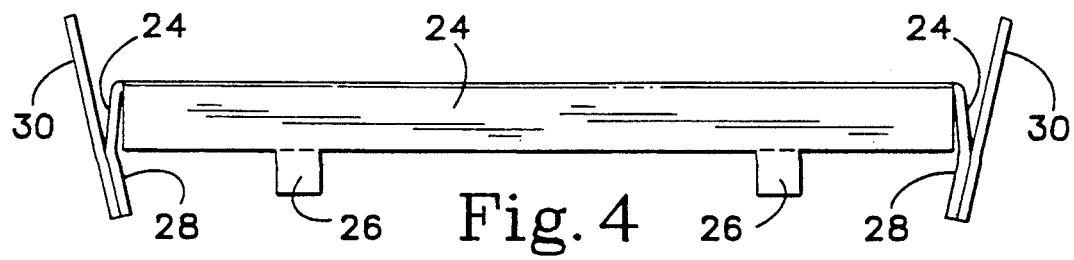
FIG. 4 is a side plan view of the cover of FIG. 3 with pinch clips attached.
Figure 5:
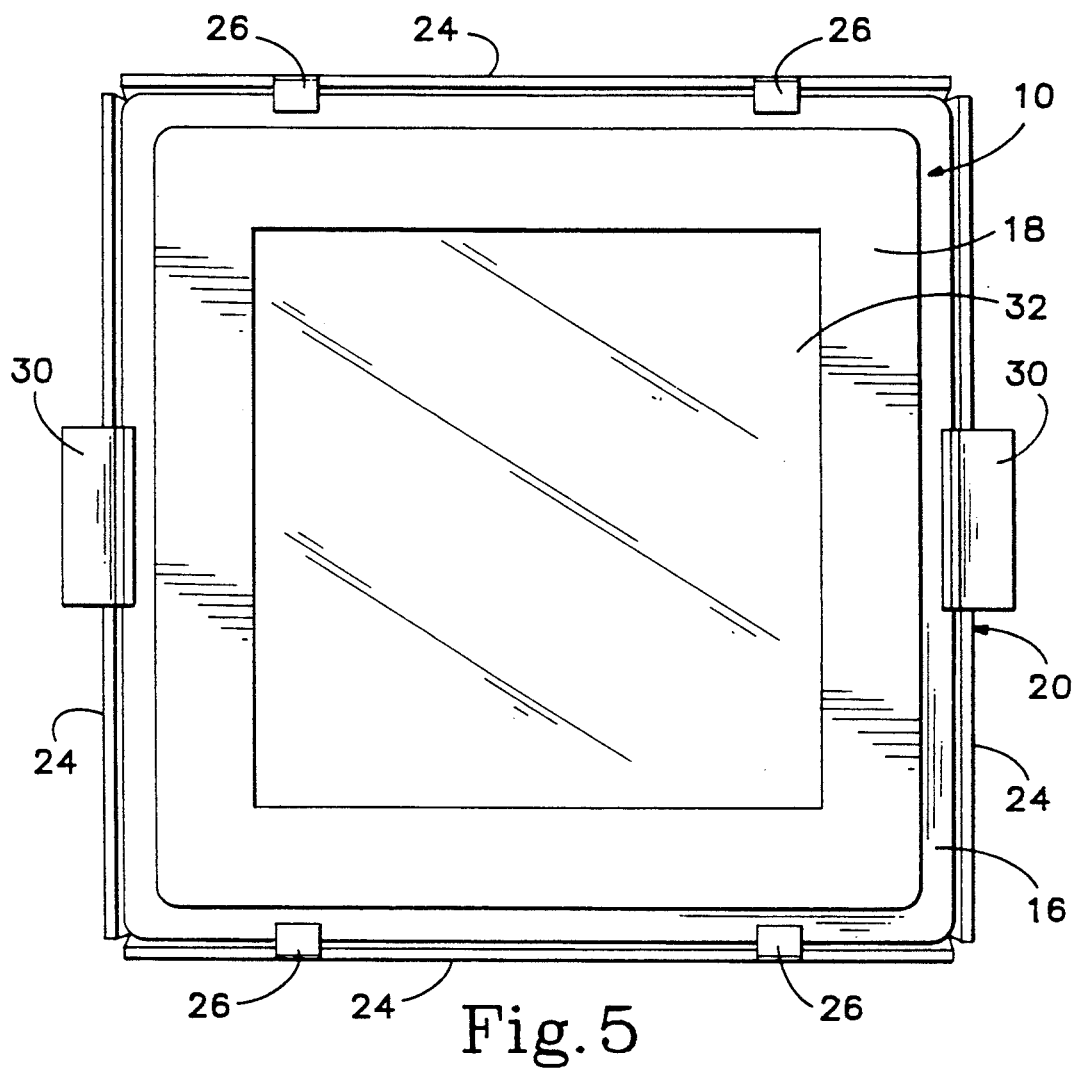
FIG. 5 is a bottom plan view of the pinch clip lid of the present invention.

As shown in FIG. 3 a cover 20 is formed from sheet metal having a central aperture 22 with four side portions 24 that are bent down as shown in FIG. 4. Two opposing sides have tabs 26 that can be bent underneath the step lid 10 to secure the sheet metal cover 20 to the step lid. The other two opposing sides have attachment tabs 28 that are bent slightly inwardly underneath the sheet metal cover. Attached to the attachment tabs 28 by suitable means, such as spot welding, are a pair of side bars 30 that form the pinch clip. The sheet metal cover 20 and side bars 30 are of an electrically conductive material, such as beryllium copper. When the sheet metal cover 20 is placed over the step lid 10, the tabs 26 are bent under the step lid to secure the sheet metal cover 20 thereto, producing a cover assembly as shown in FIG. 5. The sheet metal cover 20 aperture 22 is aligned with the step lid aperture 12, but is not as large so that a portion of the sheet metal cover 20 extends over the window 32 to further hold the window in place. The side bars 30 extend slight inwardly below the cover assembly combination.

Figure 6:
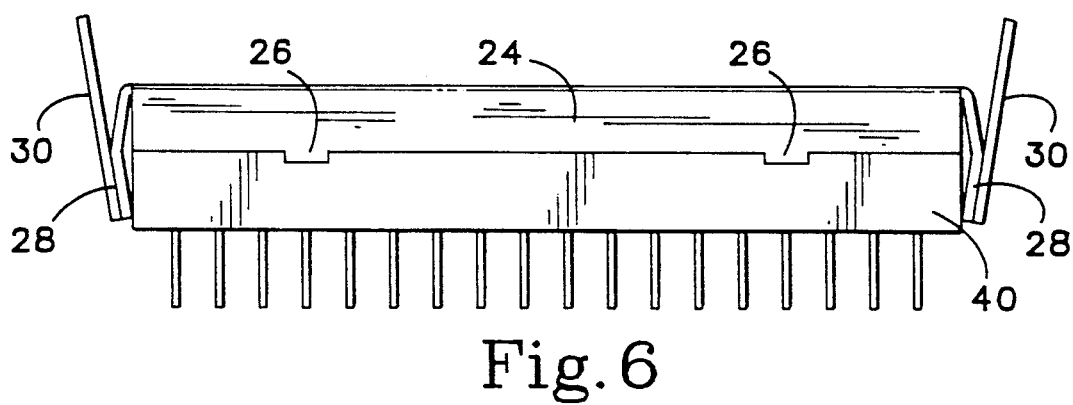
FIG. 6 is a side plan view of the pinch clip lid of the present invention attached to a non-hermetic package.

The pinch clip lid operates by pinching the upper portions of the two side bars 30 towards each other to allow the lower portions of the side bars to clear the package 40 so that the lid slips down over the top of the non-hermetic, metal package 40, as shown in FIG. 6. The center portion 18 of the step lid centers the lid on the package 40 while lower portions of the two side bars 30 exert pressure to grip the sides of the package to hold the lid in place. To remove the lid, the side bars 30 are pinched to release the pressure by the side bars on the package 40, and then the lid is lifted off.

Thus the present invention provides a pinch clip lid for a non-hermetic, metal package that protects against particulate contamination and physical damage due to handling while providing visual inspection of the exposed electronic component within the package, the lid having pinch clips that grip the package, but that release the package when pinched.

What is claimed is:

1. A lid for a non-hermetic package containing an electronic component with an exposed surface, the exposed surface for reference purposes facing upwardly along a vertical central axis, the lid comprising:
    a cover assembly having a top and sides that fits over the non-hermetic package to cover the exposed surface, the cover assembly including a transparent window mounted in an aperture of the cover assembly to provide a view of the exposed surface of the electronic component when the lid is on the non-hermetic package; and
    a pair of side bars attached on opposing sides of the cover assembly, each side bar having a lower portion that extends beneath the cover inwardly so that it is inclined toward the vertical central axis to grip the non-hermetic package when the lid is on the non-hermetic package and having an upper portion that extends above the cover assembly outwardly so that it is inclined away from the vertical central axis so that when the upper portions are pinched toward each other the lower portions release the non-hermetic package so that the lid may be removed from or placed on the non-hermetic package.

2. A lid recited in claim 1 wherein the cover assembly comprises:
    a step lid having means for centering the lid on the non-hermetic package to cover the exposed upper surface; and
    a sheet metal cover having means for attaching the sheet metal cover to the step lid and having opposing attachment tabs to which the pair of side bars is attached.

3. A lid as recited in claim 1 wherein the cover assembly is electrically conductive.

4. A lid as recited in claim 1 wherein the transparent window comprises a conductive coating.

5. A lid as recited in claim 2 wherein the step lid is electrically conductive.

6. A lid as recited in claim 2 wherein the transparent window comprises a conductive coating.

7. A non-hermetic package for an electronic component having a surface to be exposed, the package comprising:
    a package body for enclosing the electronic component and presenting the surface to be exposed through an aperture, the aperture for reference purposes facing upwardly and being perpendicular to a vertical central axis; and
    a lid, the lid comprising:
        covering means for the aperture, the covering means having a transparent window region corresponding in location to the aperture; and
        a pair of side bars attached on opposing sides of the covering means, each side bar having a lower portion that extends inwardly so that it is inclined toward the vertical central axis below the covering means to contact the package body when the lid is on and an upper portion that extends outwardly so that it is inclined away from the vertical central axis above the covering means so that when the upper portions are pinched toward each other the lower portions release the package body.

8. A non-hermetic package according to claim 7 wherein the covering means comprises:
    a step lid having means for centering the lid on the aperture; and
    a sheet metal cover having means for attaching the sheet metal cover to the step lid and having opposing attachment tabs to which the pair of side bars are attached.

9. A lid as recited in claim 7 wherein the covering means is electrically conductive.

10. A lid as recited in claim 7 wherein the transparent window comprises a conductive coating.

11. A lid as recited in claim 8 wherein the step lid is electrically conductive.

12. A lid as recited in claim 8 wherein the transparent window comprises a conductive coating.

* * * * *